(12) United States Patent
Ohashi et al.

(10) Patent No.: US 6,168,872 B1
(45) Date of Patent: Jan. 2, 2001

(54) SEMICONDUCTOR ENCAPSULATING EPOXY RESIN COMPOSITION AND SEMICONDUCTOR DEVICE

(75) Inventors: Kenji Ohashi; Tatsuya Ishizaki, both of Atsugi; Masayuki Umeno, Chigasaki; Eiichi Asano, Usui-gun; Shoichi Osada, Usui-gun; Kazutoshi Tomiyoshi, Usui-gun; Toshio Shiobara, Usui-gun, all of (JP)

(73) Assignee: Hokko Chemical Industry Co., Ltd., Tokyo (JP)

( * ) Notice: Under 35 U.S.C. 154(b), the term of this patent shall be extended for 0 days.

(21) Appl. No.: 09/220,439

(22) Filed: Dec. 24, 1998

(30) Foreign Application Priority Data

Dec. 24, 1997 (JP) .................................................... 9-366500

(51) Int. Cl.[7] .................................................... H01L 29/12
(52) U.S. Cl. .......................... 428/620; 523/451; 525/500; 525/523; 528/89
(58) Field of Search .............................. 513/451; 525/500, 525/523; 528/89; 428/620

(56) References Cited

U.S. PATENT DOCUMENTS

| | | |
|---|---|---|
| 4,328,150 | 5/1982 | Kondow et al. . |
| 4,572,853 | 2/1986 | Ikeya et al. . |
| 5,473,091 | 12/1995 | Ichiroku et al. . |

FOREIGN PATENT DOCUMENTS

| | | |
|---|---|---|
| 56-45491 | 10/1981 | (JP) . |
| 57-60779 | 12/1982 | (JP) . |
| 59-33125 | 8/1984 | (JP) . |
| 7-242683 | 9/1995 | (JP) . |

OTHER PUBLICATIONS

English Abstract for Japan 56–45491.

*Primary Examiner*—Robert Dawson
*Assistant Examiner*—D. Aylward
(74) *Attorney, Agent, or Firm*—Millen White Zelano & Branigan

(57) ABSTRACT

An epoxy resin composition comprising an epoxy resin, a curing agent, an inorganic filler, and a curing accelerator is suited for semiconductor encapsulation. A specific organic phosphorus compound is used as the curing accelerator. The composition is smoothly flowing, stable during storage, effectively curable and mold releasable and can be molded and cured into products free from wire flow and voids.

20 Claims, No Drawings

SEMICONDUCTOR ENCAPSULATING EPOXY RESIN COMPOSITION AND SEMICONDUCTOR DEVICE

BACKGROUND OF THE INVENTION

1. Field of the Invention

This invention relates to an epoxy resin composition or semiconductor encapsulation which is effectively moldable and stable during storage. It also relates to a semiconductor device encapsulated with a cured product of the composition.

2. Prior Art

The current mainstream in the semiconductor industry resides in diodes, transistors, ICs, LSIs and VLSIs of the resin encapsulation type. Epoxy resins are generally used as the encapsulating resin because they have superior moldability, adhesion, electrical properties, mechanical properties, and moisture proofness to other thermosetting resins. It is thus a common practice to encapsulate semiconductor devices with epoxy resin compositions.

Nowadays, semiconductor devices have an increasing degree of integration and the chip size is accordingly increasing. On the other hand, packages of smaller outer size are needed in order to comply with the desired size and weight reduction of electronic equipment. To accommodate such changes of chip size and package configuration, resin compositions must have a sufficiently low viscosity. Encapsulation with resin compositions having a high viscosity tends to invite molding troubles including wire flow, pad shift, void occurrence, and short fill.

To minimize damage to chips, resin compositions must be effectively curable and mold releasable. The curing and parting properties are generally improved by blending a more proportion of curing accelerator. Increased amounts of the curing accelerator blended help the resin compositions cure quickly to a higher strength and thus contribute to an improvement in mold release.

The above approach is successful in improving mold release, but causes to increase the viscosity of resin compositions, tending to invite molding troubles including wire flow, pad shift, void occurrence, and short fill as mentioned above. Also, the increased amounts of the curing accelerator blended help reaction proceed even at temperature approximate to room temperature, resulting in an increased viscosity. That is, the resin compositions lack storage stability.

An object of the invention is to provide an epoxy resin composition for semiconductor encapsulation which is effectively moldable and stable during storage while it is effectively curable and mold releasable. Another object of the invention is to provide a semiconductor device encapsulated with a cured product of the composition.

SUMMARY OF THE INVENTION

The invention pertains to a semiconductor encapsulating epoxy resin composition comprising an epoxy resin, a curing agent, an inorganic filler, and a curing accelerator as essential components. We have found that blending an organic phosphorus compound of formula (1), shown below, as the curing accelerator provides a composition which is storage stable, effectively moldable, curable and mold releasable. Therefore, semiconductor devices encapsulated with cured products of the composition are highly reliable.

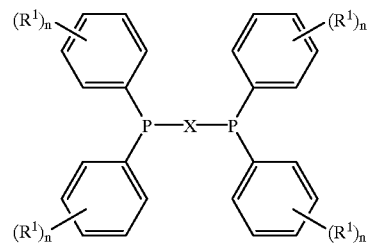

(1)

In formula (1), $R^1$ is independently hydrogen, $C_{1-4}$ alkyl or $C_{1-4}$ alkoxy, n is an integer of 0 to 5, and X is —$(CH_2)_p$— wherein p is an integer of 3 to 12, or a group represented y the following general formula (2).

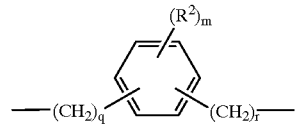

(2)

In formula (2), $R^2$ is independently hydrogen, $C_{1-4}$ alkyl or $C_{1-4}$ alkoxy, q and r each are an integer of 0 to 12, and m is an integer of 0 to 4.

DESCRIPTION OF THE PREFERRED EMBODIMENTS

The epoxy resin composition of the present invention contains an epoxy resin, a curing agent, an inorganic filler, and a curing accelerator as essential components.

The epoxy resin used herein is not limited in molecular structure and molecular weight insofar as it has at least two epoxy groups in a molecule and is curable with various curing agents as will be described later. It may be selected from prior art well-known epoxy resins. Illustrative epoxy resins include bisphenol type epoxy resins such as bisphenol A type epoxy resins and bisphenol F type epoxy resins, novolak type epoxy resins such as phenol novolak type epoxy resins and cresol novolak type epoxy resins, triphenol alkane type epoxy resins such as triphenol methane type epoxy resins and triphenol propane type epoxy resins, and polymers thereof, biphenyl skeleton-bearing epoxy resins, naphthalene skeleton-bearing epoxy resins, dicyclopentadiene-phenol novolak resins, phenol aralkyl type epoxy resins, biphenyl aralkyl type epoxy resins, glycidyl ester type epoxy resins, cycloaliphatic epoxy resins, heterocyclic epoxy resins, and halogenated epoxy resins.

The curing agent may be selected from conventional well-known compounds used as a curing agent for epoxy resins, for example, phenolic compounds, amine compounds and acid anhydrides. In particular, phenol resins having at least two phenolic hydroxyl groups in a molecule are useful. Exemplary phenolic resins are novolak type phenolic resins such as phenol novolak resins and cresol novolak resins, resol type phenolic resins, phenol aralkyl resins, triphenol alkane type phenol resins such as triphenol methane resins and triphenol propane resins, and polymers thereof, biphenyl type phenol resins, biphenyl aralkyl type phenol resins, naphthalene ring-containing phenolic resins, and dicyclopentadiene-modified phenolic resins. These curing agents may be used alone or in admixture of two or more.

The curing agent is used in a sufficient amount to cure the epoxy resin. Where a phenolic resin is used as the curing agent, the epoxy resin and the phenolic resin are preferably mixed such that 0.5 to 1.5 mol, especially 0.8 to 1.2 mol of phenolic hydroxyl groups in the phenolic resin is available per mol of epoxy groups in the epoxy resin.

Also blended in the epoxy resin composition is an inorganic filler. The filler is effective for reducing the coefficient of expansion of an encapsulant for thereby reducing the stress applied to semiconductor devices. The inorganic filler may be selected from those commonly used in conventional epoxy resin compositions. Often used are fused silica and crystalline silica in ground and spherical forms. Alumina, silicon nitride, aluminum nitride, boron nitride, titanium oxide, and glass fibers are also useful.

A blend of spherical and ground form fillers or only a spherical form filler is preferably used to meet both the requirements of moldability and minimized expansion of a cured product. The preferred inorganic filler has a mean particle size of about 5 to 30 μm. The mean particle size can be measured as a mean weight value (or a median diameter) by means of the conventional analytical methods such as a laser beam diffractometry.

For augmenting the bond between the resin and the surface of inorganic filler, it is preferred to blend an inorganic filler previously surface treated with a silane coupling agent including alkoxy silanes having a functional group such as epoxy group, (meth)acryl group, amino group, mercapto group or vinyl group. The amount of the coupling agent and the surface treatment method are not critical.

Although the amount of the inorganic filler blended is not critical, the inorganic filler is preferably blended in an amount of about 200 to 1,200 parts, especially about 400 to 1,000 parts by weight per 100 parts by weight of the epoxy resin and curing agent combined. On this basis, less than 200 parts of the filler would allow the composition to have an increased coefficient of expansion which can increase the stress applied to semiconductor devices and thus deteriorate the properties thereof. More than 1,200 parts of the filler would cause the composition to increase its viscosity to restrain molding.

According to the invention, an organic phosphorus compound of the following general formula (1) is blended as the curing accelerator for accelerating the curing reaction of the epoxy resin with the curing agent.

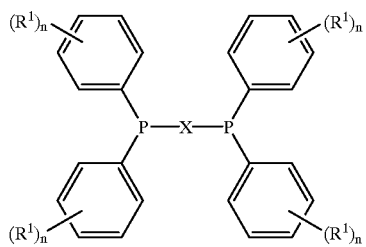

(1)

In formula (1), $R^1$ is independently hydrogen, $C_{1-4}$ alkyl or $C_{1-4}$ alkoxy, n is an integer of 0 to 5, and X is 13 $(CH_2)_p$— wherein p is an integer of 3 to 12, or a group represented by the following general formula (2).

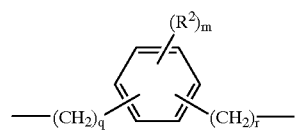

(2)

In formula (2), $R^2$ is independently hydrogen, $C_{1-4}$ alkyl or $C_{1-4}$ alkoxy, q and r each are, independently, an integer of 0 to 12, preferably 0 to 4, especially 0 or 1, and m is an integer of 0 to 4.

More illustratively, $R^1$ represents hydrogen, alkyl groups such as methyl, ethyl, propyl, isopropyl, butyl, isobutyl, and tert-butyl, or alkoxy groups such as methoxy, ethoxy, propoxy, isopropoxy, butoxy, isobutoxy and tert-butoxy. Illustrative groups represented by $R^2$ in formula (2) are the same as $R^1$.

Illustrative examples of the organic phosphorus compound of formula (1) are compounds of the following structures.

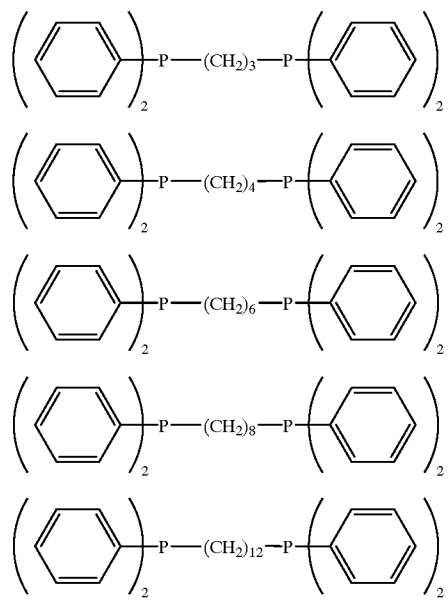

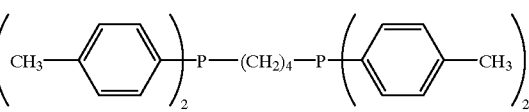

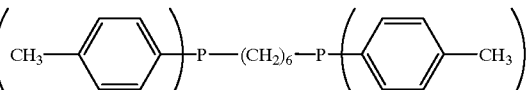

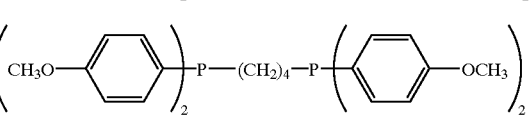

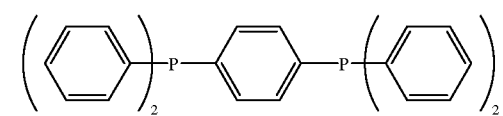

-continued

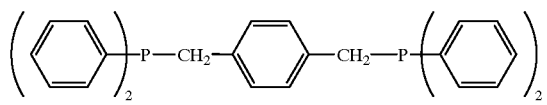

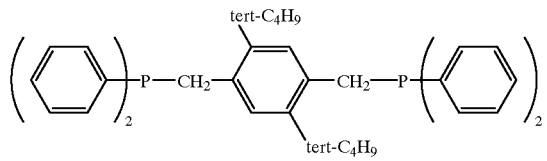

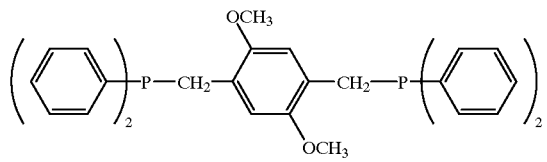

As the curing accelerator, the organic phosphorus compounds of formula (1) may be used alone or in admixture of two or more. Although the amount of the curing accelerator added is not critical, it is preferably blended in an amount of 0.5 to 500 parts by weight (or 0.001 to 1 mol), especially 5 to 250 parts by weight (or 0.01 to 0.5 mol) per 100 parts by weight of the epoxy resin and the curing agent combined. Less than 0.5 part (or 0.001 mol) of the accelerator would be insufficient to accelerate curing reaction, resulting in poor mold release. More than 500 parts (or 1 mol) of the accelerator would excessively increase the viscosity of the composition during molding and detract from moisture resistance and reliability.

Any of well-known curing accelerators may be optionally blended along with the organic phosphorus compound of formula (1) insofar as the benefits of the invention are not impaired. Such other curing accelerators include imidazole (for example, 2-methylimidazole, 2-ethylimidazole, 2-ethyl-4-methylimidazole, 2-ethyl-4,5-dimethylimidazole, 2-phenylimidazole, 2-phenyl-4-methylimidazole, 2-phenyl-4,5-dimethylimidazole, 2-phenyl-4-hydroxymethylimidazole, and 2-phenyl-4,5-di(hydroxymethyl)imidazole) and derivatives thereof, tertiary amine compounds such as triethylamine, benzyldimethylamine and α-methylbenzyldimethylamine, cycloamidine derivatives such as 1,8-diazabicyclo(5.4.0)-undecene-7, and phosphine derivatives outside the scope of formula (1) such as triphenylphosphine, tributylphosphine, tri(p-toluyl)phosphine, tri(p-methoxyphenyl)phosphine, tri(p-ethoxyphenyl)phosphine, triphenylphosphine-triphenylborate and tetraphenylphosphonium-tetraphenylborate.

For assisting in dispersing the curing accelerators in the resin composition, the curing accelerators may be premixed with the resin component which is pulverized prior to blending.

Although the semiconductor encapsulating epoxy resin composition of the present invention contains an epoxy resin, a curing agent, an inorganic filler, and a curing accelerator as essential components, various other additives may be blended therein if necessary. Such other additives include stress-reducing agents such as thermoplastic resins, thermoplastic elastomers, organic synthetic rubbers, and silicone base agents such as silicone oils, silicone rubbers, copolymers of organopolysiloxanes and epoxy resins or phenol resins; waxes such as carnauba wax, higher fatty acids, and synthetic waxes; flame retardants such as antimony oxide and halides; coloring agents such as carbon black; and halogen trapping agents. These optional agents are added in conventional amounts insofar as the benefits of the invention are not impaired.

The semiconductor encapsulating epoxy resin composition of the invention is prepared as a molding material by blending the epoxy resin, curing agent, inorganic filler, curing accelerator, and optional additives in the predetermined blending ratio, thoroughly mixing them in a mixer until uniform, melt kneading the mixture in a hot roll mill, kneader or extruder, cooling the mass for solidification, and pulverizing it into fragments of suitable size.

The semiconductor encapsulating epoxy resin composition thus obtained is useful in encapsulating a variety of semiconductor devices. The most typical encapsulating technique is low-pressure transfer molding. Desirably, the composition is molded at a temperature of 150 to 180° C. for 30 to 180 seconds and post cured at 150 to 180° C. for about 2 to 16 hours.

Owing to the use of a curing accelerator of a specific structure, the semiconductor encapsulating epoxy resin composition of the invention has improved curing and parting properties as well as smooth flow and storage stability so that it can be effectively molded and cured into cured products without molding troubles including wire flow, pad shift, void occurrence, and short fill. Semiconductor devices encapsulated with cured products of the inventive composition are moisture proof and highly reliable.

EXAMPLE

Examples of the present invention are given below by way of illustration and not by way of limitation. All parts are by weight.

Examples 1–5 & Comparative Examples 1–3

Epoxy resin compositions for semiconductor encapsulation were prepared by uniformly melt mixing the components shown in Table 1 in a hot twin-roll mill, cooling and pulverizing the mass. It is noted that the curing accelerators used had the structure shown below, and the amount of the curing accelerator added was 0.005 mol per 100 parts of the epoxy resin and curing agent combined.

Curing accelerator A

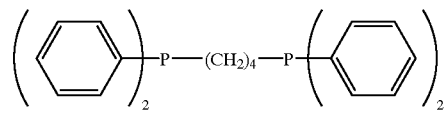

Curing accelerator B

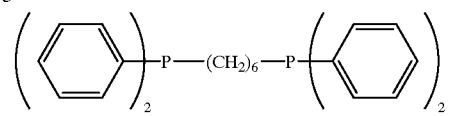

Curing accelerator C

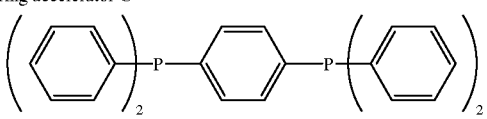

Curing accelerator D

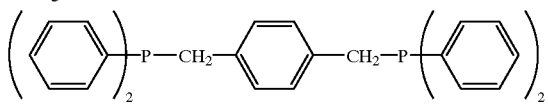

These compositions were measured for various properties by the following methods. The results are also shown in Table 1.

Spiral Flow

Using a mold as prescribed by the EMMI standard, spiral low was measured under conditions: 175° C., 70 kg/cm² and 120 seconds.

Gel Time

An epoxy resin composition was heated on a hot plate at 175° C. until the composition gelled.

Melt Viscosity

Using a Kouka type flow tester (by Shimazu Mfg. K.K.), a viscosity was measured at a temperature of 175° C. and a pressure of 10 kg/cm².

Hardness as Molded

An epoxy resin composition was molded at 175° C. and 70 kg/cm² for 90 seconds into a bar of 10×4×100 mm according to JIS K-6911. Using a Barcol hardness tester, the bar was measured for hot hardness.

Glass Transition Temperature (Tg) and Coefficient of Linear Expansion (α)

An epoxy resin composition was molded at 175° C. and 70 kg/cm² for 120 seconds and post cured at 180° C. for 4 hours, forming a test piece of 4×4×15 mm. The piece was examined by means of a dilatometer while heating it at a rate of 5° C./min.

Molding (Voids and Gold Wire Flow)

A silicon chip sized 9×10×0.3 mm was attached to a die pad sized 10×15 mm to construct a 100-pin QFP (42 alloy) sized 14×20×2.7 mm. Gold wires were bonded thereto. Using an auto-molding machine, an epoxy resin composition was transfer molded over this semiconductor part at a temperature of 175° C., a pressure of 70 kg/cm², and a transfer speed of 10 seconds. The number of external voids on the package was counted, and gold wire flow was observed.

Moisture Proofness

A silicon chip of 6×6 mm having aluminum wiring formed thereon was bonded to a 14-pin DIP frame (42 alloy), and the aluminum electrode on the chip surface was wire bonded to the lead frame with a gold wire having a diameter of 30 μm. An epoxy resin composition was molded over this semiconductor part at 175° C. and 70 kg/cm² for 120 seconds and post cured at 180° C. for 4 hours. With a biasing voltage of −20 volts applied, the package was allowed to stand for 72 hours in an atmosphere of 121° C. and RH 100%. The number of packages in which aluminum corroded was counted.

Storage

An epoxy resin composition was placed in a sealed bag of aluminum and allowed to stand for 72 hours in a constant temperature chamber at 25° C. The aged composition was measured for spiral flow, and a percent drop from the initial spiral flow calculated. The value of storage in Table 1 shows the ratio (percent) of the spiral flow value of the aged composition to the spiral flow value of the initial composition before aging.

TABLE 1

| Composition (pbw) | E1 | E2 | E3 | E4 | E5 | CE1 | CE2 | CE3 |
|---|---|---|---|---|---|---|---|---|
| Novolak type epoxy resin[1] | — | — | — | — | 50.4 | — | — | 50.4 |
| Biphenyl type epoxy resin[2] | 49.4 | 49.4 | 49.4 | 49.4 | — | 49.4 | 49.4 | — |
| Curing agent[3] | 46.3 | 46.3 | 46.3 | 46.3 | 45.3 | 46.3 | 46.3 | 45.3 |
| Brominated epoxy resin[4] | 4.3 | 4.3 | 4.3 | 4.3 | 4.3 | 4.3 | 4.3 | 4.3 |
| Antimony trioxide | 2 | 2 | 2 | 2 | 2 | 2 | 2 | 2 |
| Fused silica | 750 | 750 | 750 | 750 | 550 | 750 | 750 | 550 |
| Carbon black | 1.5 | 1.5 | 1.5 | 1.5 | 1.5 | 1.5 | 1.5 | 1.5 |
| Silane coupling agent[5] | 1.5 | 1.5 | 1.5 | 1.5 | 1.5 | 1.5 | 1.5 | 1.5 |
| Carnauba wax | 1.5 | 1.5 | 1.5 | 1.5 | 1.5 | 1.5 | 1.5 | 1.5 |
| Curing accelerator A | 2.2 | — | — | — | 2.2 | — | — | — |
| Curing accelerator B | — | 2.2 | — | — | — | — | — | — |
| Curing accelerator C | — | — | 2.2 | — | — | — | — | — |
| Curing accelerator D | — | — | — | 2.4 | — | — | — | — |
| Triphenylphosphine | — | — | — | — | — | 1.3 | — | 1.3 |
| Tetraphenylphosphonium tetraphenylborate | — | — | — | — | — | — | 3.3 | — |
| Spiral flow (cm) | 110 | 100 | 130 | 110 | 90 | 90 | 110 | 70 |
| Gelling time (sec.) | 23 | 21 | 24 | 21 | 14 | 18 | 28 | 14 |
| Melt viscosity (poise) | 120 | 120 | 100 | 120 | 250 | 160 | 120 | 300 |
| Hardness as molded | 70 | 70 | 60 | 60 | 80 | 60 | 40 | 70 |
| Tg (° C.) | 125 | 125 | 125 | 125 | 160 | 110 | 110 | 160 |
| α1 ($10^{-5}$/° C.) | 1.0 | 1.0 | 1.0 | 1.0 | 1.2 | 1.0 | 1.0 | 1.2 |
| α2 ($10^{-5}$/° C.) | 3.8 | 3.8 | 3.8 | 3.8 | 5.2 | 3.8 | 3.8 | 5.2 |
| Molding | | | | | | | | |
| Voids | 0/20 | 0/20 | 0/20 | 0/20 | 0/20 | 12/20 | 1/20 | 5/20 |
| Au wire flow (%) | 1 | 1 | 1 | 1 | 3 | 5 | 3 | 7 |
| Moisture proofness | 0/20 | 0/20 | 0/20 | 0/20 | 0/20 | 0/20 | 4/20 | 0/20 |
| Storage (%) | 93 | 92 | 90 | 91 | 95 | 68 | 76 | 82 |

Note:
[1]EOCN-3300: cresol novolak type epoxy resin with epoxy equivalent 195 by Nippon Kayaku K.K.
[2]YX 400HK: biphenyl type epoxy resin with epoxy equivalent 190 by Yuka Shell K.K.
[3]XL-225-3L: phenol aralkyl resin with phenol equivalent 168 by Mitsui Toatsu Chemical K.K.
[4]BREN-105: phenol novolak type brominated epoxy resin with epoxy equivalent 280 and bromine content 35% by Nippon Kayaku K.K.
[5]silane coupling agent KBM-403: γ-glycidoxypropyltrimethoxysilane by Shin-Etsu Chemical Industry Co., Ltd.

As is evident from Table 1, epoxy resin compositions having blended therein curing accelerators of specific structures falling within the scope of the invention are smoothly flowing and stable during storage and cure into products free from wire flow and voids. Semiconductor devices encapsulated with the inventive compositions are moisture proof and highly reliable.

Japanese Patent Application No. 366500/1997 is incorporated herein by reference.

Reasonable modifications and variations are possible from the foregoing disclosure without departing from either the spirit or scope of the present invention as defined by the claims.

What is claimed is:

1. A semiconductor encapsulating epoxy resin composition comprising an epoxy resin, a curing agent, an inorganic filler, and a curing accelerator as essential components, said curing accelerator comprising an organic phosphorus compound of the following general formula (1):

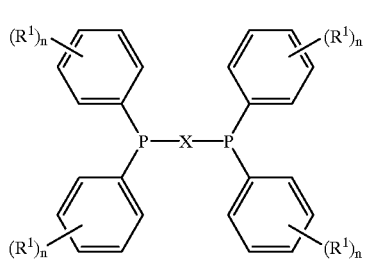

(1)

wherein $R^1$ is independently hydrogen, $C_{1-4}$ alkyl or $C_{1-4}$ alkoxy, n is an integer of 0 to 5, X is —$(CH_2)_p$— or a group represented by the following general formula (2):

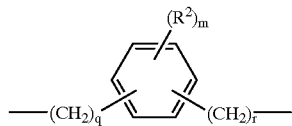

(2)

wherein $R^2$ is independently hydrogen, $C_{1-4}$ alkyl or $C_{1-4}$ alkoxy, p is an integer of 3 to 12, q and r each are, independently, an integer of 0 to 12, and m is an integer of 0 to 4.

2. A semiconductor device encapsulated with a cured product of the epoxy resin composition of claim 1.

3. A circuit board incorporating the encapsulated semiconductor device of claim 2.

4. The semiconductor encapsulating epoxy resin composition of claim 1 wherein the curing agent is a phenolic compound.

5. The semiconductor encapsulating epoxy resin composition of claim 1 wherein the inorganic filler is surface treated with a silane.

6. The semiconductor encapsulating epoxy resin composition of claim 1 wherein the curing accelerator is an amount of 5 to 250 parts by weight per 100 parts by weight of the combined epoxy resin and curing agent.

7. The semiconductor encapsulating epoxy resin composition of claim 1 further comprising a second curing accelerator which is an imidazole compound, a tertiary amine compound, or a phosphoric compound.

8. The semiconductor encapsulating epoxy resin composition of claim 1 further comprising a stress-reducing agent; a thermoplastic elastomer; an organic synthetic rubber; a silicone oil; a silicone rubber; a copolymer of an organopolysiloxane and an epoxy or a phenol resin; a wax; a higher fatty acid; a synthetic wax; a flame retardant selected from an antimony oxide or a halide; a coloring agent; and/or a halogen trapping agent.

9. The semiconductor encapsulating epoxy resin composition of claim 1 wherein R' is independently $C_{1-4}$ alkyl or $C_{1-4}$ alkoxy.

10. The semiconductor encapsulating epoxy resin composition of claim 1 wherein the epoxy resin is a biphenyl epoxy resin.

11. The semiconductor encapsulating epoxy resin composition of claim 1 wherein the epoxy resin is a phenol novolak brominated epoxy resin.

12. The semiconductor encapsulating epoxy resin composition of claim 1 wherein the curing agent is a phenol aralkyl resin.

13. A method of producing a semiconductor encapsulating epoxy resin composition comprising mixing an epoxy resin, a curing agent, an inorganic filler, and a curing accelerator;

wherein said curing accelerator comprises an organic phosphorus compound of the following general formula (1):

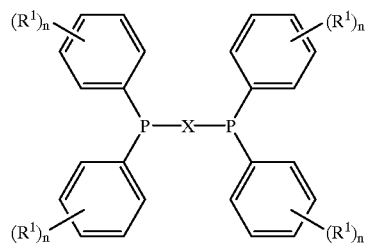

(1)

wherein $R^1$ is independently hydrogen, $C_{1-4}$ alkyl or $C_{1-4}$ alkoxy, n is an integer of 0 to 5, X is —$(CH_2)_p$— or a group represented by the following general formula (2):

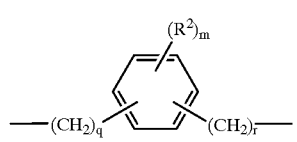

(2)

wherein $R^2$ is independently hydrogen, $C_{1-4}$ alkyl or $C_{1-4}$ alkoxy, p is an integer of 3 to 12, q and r each are, independently, an integer of 0 to 12, and m is an integer of 0 to 4.

14. A curing accelerator comprising an organic phosphorus compound of the following general formula (1):

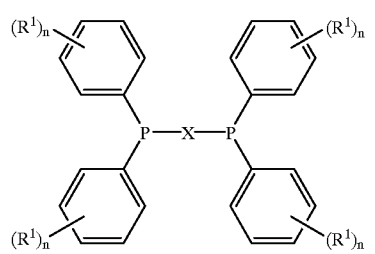

(1)

wherein $R^1$ is independently hydrogen, $C_{1-4}$ alkyl or $C_{1-4}$ alkoxy, n is an integer of 0 to 5, X is —$(CH_2)_p$— or a group represented by the following general formula (2):

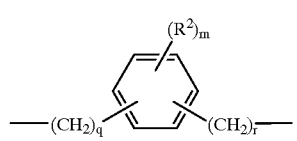

(2)

wherein $R^2$ is independently hydrogen, $C_{1-4}$ alkyl or $C_{1-4}$ alkoxy, p is an integer of 3 to 12, q and r each are, independently, an integer of 0 to 12, and m is an integer of 0 to 4.

15. The semiconductor encapsulating epoxy resin composition of claim 1 wherein p is an integer of 4 to 12.

16. The semiconductor encapsulating epoxy resin composition of claim 1 wherein p is an integer of 5 to 12.

17. The semiconductor encapsulating epoxy resin composition of claim 1 wherein X is represented by the following general formula (2):

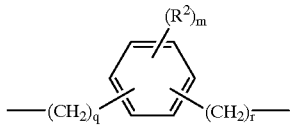

(2)

wherein $R^2$ is independently hydrogen, $C_{1-4}$ alkyl or $C_{1-4}$ alkoxy, q and r each are, independently, an integer of 0 to 12, and m is an integer of 0 to 4.

18. The curing accelerator of claim 14 wherein X is represented by the following general formula (2):

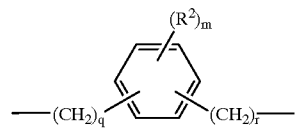

(2)

wherein $R^2$ is independently hydrogen, $C_{1-4}$ alkyl or $C_{1-4}$ alkoxy, q and r each are, independently, an integer of 0 to 12, and m is an integer of 0 to 4.

19. The curing accelerator of claim 14 wherein p is an integer of 4 to 12.

20. The curing accelerator of claim 14 wherein p is an integer of 5 to 12.

* * * * *

UNITED STATES PATENT AND TRADEMARK OFFICE
CERTIFICATE OF CORRECTION

PATENT NO.     : 6,168,872 B1
DATED          : January 2, 2001
INVENTOR(S)    : Ohashi et al.

It is certified that error appears in the above-identified patent and that said Letters Patent is hereby corrected as shown below:

<u>Title page,</u>
Item [73], Assignee has been incorrectly printed as "Hokko Chemical Industry Co., Ltd." it should correctly read as follows: -- Hokko Chemical Industry Co., Ltd. and Shin-Etsu Chemical Co., Ltd. --

Signed and Sealed this

Fourth Day of February, 2003

JAMES E. ROGAN
*Director of the United States Patent and Trademark Office*